(12) United States Patent
Wang et al.

(10) Patent No.: US 8,048,689 B2
(45) Date of Patent: Nov. 1, 2011

(54) SEMICONDUCTOR CHIP WITH BACKSIDE CONDUCTOR STRUCTURE

(75) Inventors: Liang Wang, Austin, TX (US); Michael R. Bruce, Austin, TX (US)

(73) Assignee: Globalfoundries Inc., Grand Cayman (KY)

( * ) Notice: Subject to any disclaimer, the term of this patent is extended or adjusted under 35 U.S.C. 154(b) by 197 days.

(21) Appl. No.: 12/237,568

(22) Filed: Sep. 25, 2008

(65) Prior Publication Data

US 2010/0072620 A1 Mar. 25, 2010

(51) Int. Cl.
*H01L 21/44* (2006.01)
*H01L 21/66* (2006.01)

(52) U.S. Cl. ........... 438/14; 438/652; 438/10; 438/462; 438/597; 438/621; 438/637; 438/672; 438/700; 438/706; 438/704; 438/743; 257/E21.219; 257/E21.252; 257/E21.309; 257/E21.347

(58) Field of Classification Search ............... 257/750, 257/E21.576, E21.219, E21.252, E21.309, 257/E21.347; 438/652, 16, 17, 14, 10, 462, 438/597, 621, 637, 672, 700, 706, 704, 743
See application file for complete search history.

(56) References Cited

U.S. PATENT DOCUMENTS

| | | | | |
|---|---|---|---|---|
| 4,990,462 | A * | 2/1991 | Sliwa, Jr. ....................... | 438/107 |
| 6,291,272 | B1 * | 9/2001 | Giri et al. ....................... | 438/121 |
| 6,599,132 | B1 * | 7/2003 | Perozziello et al. ............ | 438/17 |
| 6,990,264 | B2 * | 1/2006 | Telkamp et al. ................ | 385/16 |
| 7,067,742 | B2 * | 6/2006 | DiStefano et al. ............. | 174/261 |
| 7,592,209 | B2 * | 9/2009 | Chang ........................... | 438/149 |
| 2005/0260775 | A1 * | 11/2005 | DiBattista et al. ................ | 438/4 |
| 2006/0046463 | A1 * | 3/2006 | Watkins et al. ............... | 438/622 |
| 2007/0010097 | A1 * | 1/2007 | Deering et al. ............... | 438/690 |
| 2007/0190692 | A1 * | 8/2007 | Erturk et al. .................. | 438/118 |
| 2010/0019385 | A1 * | 1/2010 | Bartley et al. ................. | 257/741 |

OTHER PUBLICATIONS

Yoshio Kikuchi et al.; *Quantitative Ultra Shallow Dopant Profile Measurement by Scanning Capacitance Microscope*; FUJITSU Sci. Tech. J., 38, 1; Jun. 2002; pp. 75-81.

Jessica Hartwich et al.; *Characterization of ultra-thin SOI transistors down to the 20nm gate length regime with Scanning Spreading Resistance Microscopy (SSRM)*; 2003 IEEE; pp. 427-430.

Jon C. Lee et al.; *Fault localization in Contact Level by Using Conductive Atomic Force Microscopy*; Proceedings from the 29th International Symposium for Testing and Failure Analysis, Nov. 2-6, 2003; pp. 413-418.

RK Jain et al.; *Novel and Practical Method of Through Silicon FIB Editing of SOI Devices*; Proceedings of the 31st International Symposium for Testing and Failure Analysis; Nov. 6-10, 2005 ASM International; pp. 70-77.

(Continued)

*Primary Examiner* — Ngan Ngo
*Assistant Examiner* — Benjamin Tzu-Hung Liu
(74) *Attorney, Agent, or Firm* — Ditthavong Mori & Steiner, P.C.

(57) ABSTRACT

Various semiconductor devices and methods of testing such devices are disclosed. In one aspect, a method of manufacturing is provided that includes forming a bore from a backside of a semiconductor chip through a buried insulating layer and to a semiconductor device layer of the semiconductor chip. A conductor structure is formed in the bore to establish an electrically conductive pathway between the semiconductor device layer and the conductor structure. The conductor structure may provide a diagnostic pathway.

13 Claims, 6 Drawing Sheets

OTHER PUBLICATIONS

P. Eyben et al.; *Scanning spreading resistance microscopy (SSRM) 2d carrier profiling for ultra-shallow junction characterization in deep-submicron technologies*; Materials Science and Engineering B 124-125 (2005); pp. 45-53.

J.S. McMurray et al.; *Identification of Root Cause Failure in Silicon on Insulator Body Contacted nFETs using Scanning Capacitance Microscopy and Scanning Spreading Resistance Microscopy*; Proceedings of the 32nd International Symposium for Testing and Failure Analysis; Nov. 12-16, 2006 ASM International; pp. 102-108.

Li Zhang et al.; *High-resolution characterization of ultra-shallow junctions by measuring in vacuum with scanning spreading resistance microscopy*; Applied Physics Letters 90, 192103 (2007); pp. 1-3.

Li Zhang et al.; *High resolution of characterization of ultra-shallow junctions by measuring in vacuum with scanning spreading resistance microscopy*; 2007 IEEE; pp. 516-519.

\* cited by examiner

SEMICONDUCTOR CHIP WITH BACKSIDE CONDUCTOR STRUCTURE

BACKGROUND OF THE INVENTION

1. Field of the Invention

This invention relates generally to semiconductor processing, and more particularly to structures and methods for testing areas of a semiconductor chip.

2. Description of the Related Art

Scanning probe microscopy is an umbrella term that covers several scanning techniques used to diagnose semiconductor chips, such as, conducting atomic force microscopy, scanning spreading resistance microscopy, scanning capacitance microscopy and scanning tunneling microscopy. These techniques are frequently used to perform diagnostic tests on semiconductor chips, particularly, though not exclusively, after a semiconductor chip has been fabricated and subsequently deprocessed in order to expose circuit structures or other areas of interest that are slated for diagnostic examination. One requirement shared by most scanning probe microscopy techniques is a conducting pathway between a probe tip and a source of bias or voltage through the chip. In bulk semiconductor devices, the establishment of the requisite conducting pathway is a relatively straight forward matter of attaching a conductor to the bulk semiconductor side of the chip and touching or bringing the probe tip in close proximity to an area of interest of the opposite side of the chip. However, the situation is more complex in semiconductor-on-insulator dice, particularly for certain types of p-channel devices thereof. The difficulty stems from the fact that in many conventional semiconductor-on-insulator designs with p-channel devices, isolation structures are used to isolate one or perhaps a few p-channel devices from adjacent devices. These isolation structures then form laterally impenetrable barriers to conductive pathways that would ordinarily be used for SPM analysis.

One conventional technique for performing SPM analysis on a semiconductor-on-insulator chip involves the formation of a via through the front side of the semiconductor chip. In this regard, the semiconductor chip is deprocessed down to the active device layer and a deep trench is formed through the active device layer and penetrating the buried insulating layer and in a certain distance into the base semiconductor layer. This conventional technique provides a somewhat manageable system for performing SPM analysis in a n-channel area that is not radically segregated by isolation structures. However, even in such relatively open n-channel areas, this conventional technique suffers from a drawback associated with a somewhat unpredictable sheet resistance that is a function of the distance from the area of interest that the probe tip is contacting to the position of the conducting via through the front side of the chip.

A more difficult problem is associated with p-channel active areas in a semiconductor-on-insulator chip. In these circumstances, a conducting via formed through the front side of the chip may yield information only on an extremely small portion of the chip that is within a particular semiconductor device active island circumscribed by an isolation structure. It may even prove difficult to fabricate diagnostic via without destructively altering the p-channel region.

The present invention is directed to overcoming or reducing the effects of one or more of the foregoing disadvantages.

SUMMARY OF THE INVENTION

In accordance with one aspect of the present invention, a method of manufacturing is provided that includes forming a bore from a backside of a semiconductor chip through a buried insulating layer and to a semiconductor device layer of the semiconductor chip. A conductor structure is formed in the bore to establish an electrically conductive pathway between the semiconductor device layer and the conductor structure.

In accordance with another aspect of the present invention, a method of manufacturing is provided that includes forming a bore from a backside of a semiconductor chip through a buried insulating layer and to a semiconductor device layer of the semiconductor chip. A conductor structure is formed in the bore to establish an electrically conductive pathway between the semiconductor device layer and the conductor structure. A diagnostic instrument is electrically connected to the conductor structure and the semiconductor device layer and a diagnostic test is performed on the semiconductor chip with the diagnostic instrument.

In accordance with another aspect of the present invention, an apparatus is provided that includes a semiconductor chip that has a base substrate with a backside, a semiconductor device layer and a buried insulating layer positioned between the base substrate and the semiconductor device layer. A conductor structure is positioned in a bore extending from the backside of the base substrate through the buried insulating layer and to the semiconductor device layer to establish an electrically conductive pathway between the semiconductor device layer and the conductor structure.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
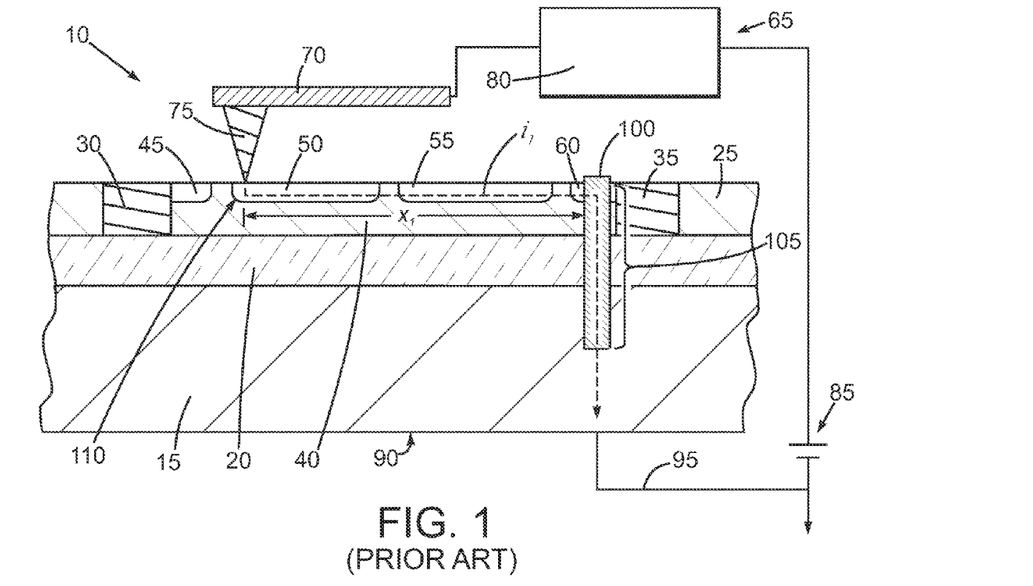
FIG. 1 is a sectional view of an exemplary conventional semiconductor chip substrate that has been retrofitted to enable scanning probe microscopy for the purpose of performing a failure analysis on the chip.

In the drawings described below, reference numerals are generally repeated where identical elements appear in more than one figure. Turning now to the drawings, and in particular to FIG. 1, therein is shown a sectional view of an exemplary conventional semiconductor chip substrate 10 that has been retrofitted to enable scanning probe microscopy (SPM) for the purpose of performing a failure analysis on the chip 10. The chip 10 is implemented as a silicon-on-insulator substrate that includes a bulk silicon base 15, a buried oxide layer 20 and a top silicon active layer 25. The top active layer 25 is sub-divided into various device regions circumscribed by isolation structures 30 and 35. In this illustration, a device region 40 is circumscribed by the isolation structures 30 and 35. The isolation structures 30 and 35 may actually be part of the same isolation structure. The device region 40 includes a plurality of dopant regions 45, 50, 55 and 60. The dopant regions 45, 50, 55 and 60 are formed by establishing dopant concentrations within the silicon active layer 25. A source/drain region is a typical implementation of dopant regions such as the regions 45, 50, 55 and 60. A scanning probe microscopy system 65 is used to perform various types of scanning probe microscopy on the chip 10. The SPM system 65 includes a probe member 70 that has a probe tip 75 projecting downwardly therefrom. The probe 70 is electrically connected to a diagnostic instrument 80. The diagnostic instrument 80 is operable to obtain signals indicative of properties of the chip 10 and the active layer 25 thereof. The diagnostic instrument 80 typically includes an amplifier that may be a linear, logarithmic or other type. The diagnostic instrument 80 is, in turn, connected to a voltage source 85. Another terminal of the voltage source 85 is connected to the back side 90 of the bulk silicon base 15 by way of a conductor 95. In order for the SPM system 65 to function properly, there must be an ohmic pathway between the tip 75 and the conductor 95. This is not natively possible with the chip 10 due to the presence of the buried oxide layer 20. To overcome this obstacle, a via 100 is formed in the chip 10 traversing through the active silicon layer 25, the buried oxide layer 20 and into the bulk silicon base 15. The via 100 is conventionally established by etching a very deep trench 105 through the active silicon layer 25, the buried oxide layer 20 and into the bulk silicon base 15. Thereafter, platinum is deposited into the trench 105 to establish the via 100.

Assume for the purposes of this illustration that it is desired to perform an SPM analysis on an area of interest 110 in the active silicon layer 25. In this illustration, the area of interest 110 is in the dopant region 50. With a tip 75 positioned proximate the area of interest 110 either in contact with the dopant region or slightly above, in the case of a capacitive test where a dielectric is in place, the voltage source 85 is activated and a current pathway is established between the tip 75 and the conductor 95 such that a current $i_1$ can flow from the area of interest 110 through the dopant regions 50, 55 and a portion of 60 and down through the via 100 into the bulk silicon 15 and ultimately to the conductor 95. The current is sensed by the amplifying instrument 80 and used to interpret the characteristics of the area of interest 110. Because the portion of the chip represented in FIG. 1, and in particular the device region 40, is a n-channel configuration, the current $i_1$ can readily flow from the tip 75 across the expanse of the device region 40 and into the via 100. This is possible because the various dopant regions 45, 50, 55 and 60 are not individually isolated by way of isolation structures such as the isolation structures 30 and 35. Accordingly, data can be obtained using this conventional technique for n-channel regions. However, an issue does remain with regard to an artifact associated with the distance, x, from the tip 75 to the via 100. There is a finite series resistance along the device region 40 from the tip 75 to the via 100. This series resistance is approximately equal to the device resistance at the area of interest 110. Therefor, the measured electrical properties at the area of interest 110 will vary depending upon the distance $x_1$ from the via. This artifact can make the ability of system 65 to delineate fine electrical properties such as the doping profile of a given dopant region 45, 50, 55 or 60 difficult.

Figure 2:
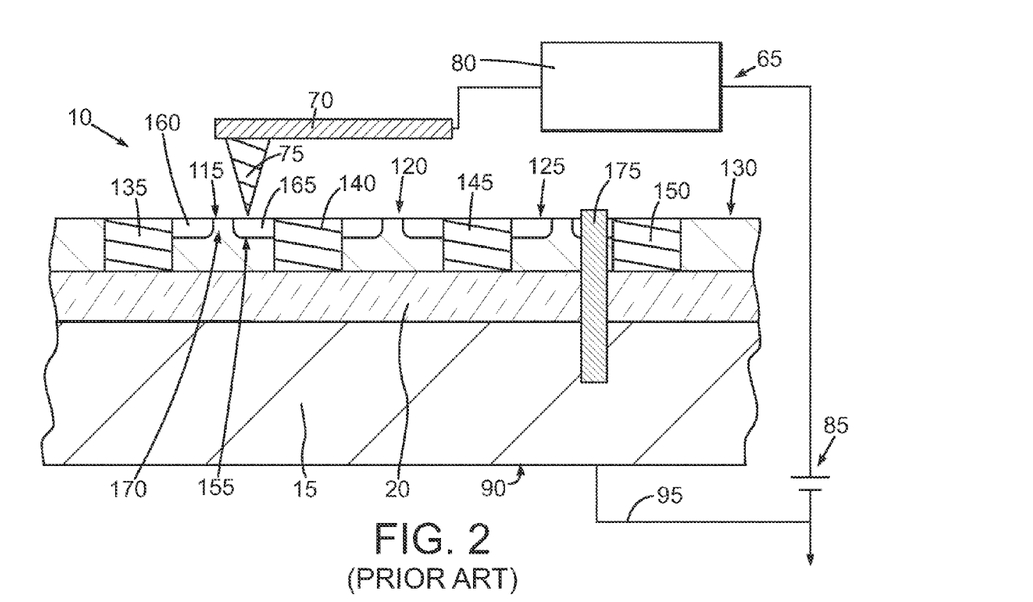
FIG. 2 is another sectional view of the chip depicted in FIG. 1.

Attention is now directed to FIG. 2, which is a sectional view of another portion of the semiconductor chip 10. At the portion of the chip 10 depicted in FIG. 2, there are several p-channel device regions 115, 120, 125 and 130 depicted. The device regions 115, 120, 125 and 130 are isolated laterally by way of isolation structures 135, 140, 145 and 150. The lateral isolation of particular device regions such as the regions 115, 120, 125 and 130 is more typical for certain types of designs that use p-channel structures. Again, assume for the purposes of illustration that it is desired to perform a SPM analysis on an area of interest 155 of the device region 115. In this regard, the device region 115 includes dopant regions 160 and 165 that are separated laterally to define a channel 170. There are similar dopant regions in the device regions 120 and 125 that are not separately labeled. Again, the SPM system 65 is positioned so that the tip 75 of the probe 70 is proximate the area of interest 155 and the conductor 95 is in ohmic contact with the back side 90 of the bulk silicon base 15. Merely using another via 175 that penetrates through the device region 125 through the buried oxide layer 20 and into the bulk silicon base 15 is not sufficient to establish an electrical pathway between the probe 75 at the area of interest 155 and the conductor 95 regardless of the sensitivity of the diagnostic instrument 80. This follows from the presence of the intervening isolation structures 140 and 145 between the area of interest 155 and the via 175. It might be possible to position individual vias in individual device regions. However, this approach has the distinct possibility of destroying the dopant regions in the device region and thus would not yield useful test results. Thus, for p-channel type regions, the conventional apparatus and method shown in FIGS. 1 and 2 is insufficient for performing SPM analysis.

Figure 3:
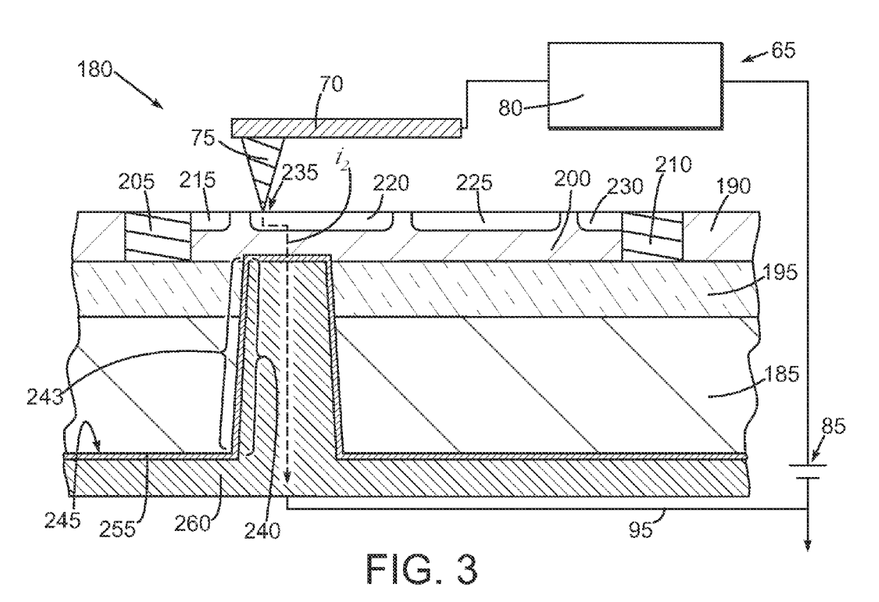
FIG. 3 is a sectional view of an exemplary embodiment of a semiconductor chip provided with a backside conductor structure.

An exemplary improved apparatus and method for performing SPM analysis on an area of interest in a semiconductor chip may be understood by referring now to FIG. 3, which is a sectional view of a small portion of a semiconductor chip 180. The semiconductor chip 180 is implemented as a semiconductor-on-insulator design that includes a bulk semiconductor base 185, an active semiconductor layer 190 and a buried insulating layer 195 sandwiched there between. The bulk semiconductor layer 185 may be silicon, germanium, or another type of semiconductor as desired. The active semiconductor layer 190 may be composed of silicon, germanium, or another type of semiconductor as desired. The buried insulating layer 195 may consist of silicon dioxide, tetra ethyl ortho silicate, or another type of insulating material as desired. The portion of the semiconductor chip 180 visible in FIG. 3 includes a device region 200 that is isolated laterally by way of respective isolation structures 205 and 210. The device region 200 includes dopant regions 215, 220, 225 and 230. The dopant regions 215, 220, 225 and 230 may be source/drain regions, resistors, or virtually any other type of region used in a device region of a semiconductor chip. For purposes of this illustration, assume that an area of interest 235 located in the dopant region 220 is targeted for SPM analysis. By way of the SPM system 65 that, as noted above, consists of a probe 70 with a downwardly projecting tip 75, the diagnostic instrument 80, a voltage source 85 and a conductor 95 that is designed to establish contact with the semiconductor chip 180 so as to establish a current path between the tip 75 and the conductor 95. Unlike the conventional design depicted in FIGS. 1 and 2 where via 100 or 175 is formed by etching a deep trench down through the active silicon layer, in this illustrative embodiment, a conductor structure 240 is formed in a bore 243 through the back side 245 of the semiconductor base 185. The conductor structure 240 projects completely through the semiconductor base 185 and the buried insulating layer 195, and at least to, and in this illustrative embodiment into somewhat, the active silicon layer 190. The conductor structure 240 is formed proximate the area of interest 235 targeted for SPM analysis. In this way, an ohmic pathway is established for a current $i_2$ to flow between the probe 75 and the conductor 95 which is electrically connected to the conductor structure 240.

In this illustrative embodiment, the conductor structure 240 consists of a seed layer 255 that is then filled with a bulk conductor material 260. The seed layer 255 and the bulk conductor 260 may extend laterally across the surface of the back side 245 of the bulk semiconductor 185 as shown if desired. The conductor structure 240 may be fabricated at virtually any location where an area of interest is positioned. In this way, an ohmic pathway may be established between the probe 75 and the conductor 95 in very close proximity to area of interest 235 and thus without the unwanted artifact effects associated with the conventional technique and the relationship to the distance between a conventional via and the area of interest. Furthermore, because the conductor structure 240 can be positioned virtually anywhere proximate a device region, p-channel devices may be readily subjected to SPM analysis without the constraints of the multiple isolation structures that would otherwise cutoff the current pathway as shown in FIG. 2.

Figure 4:
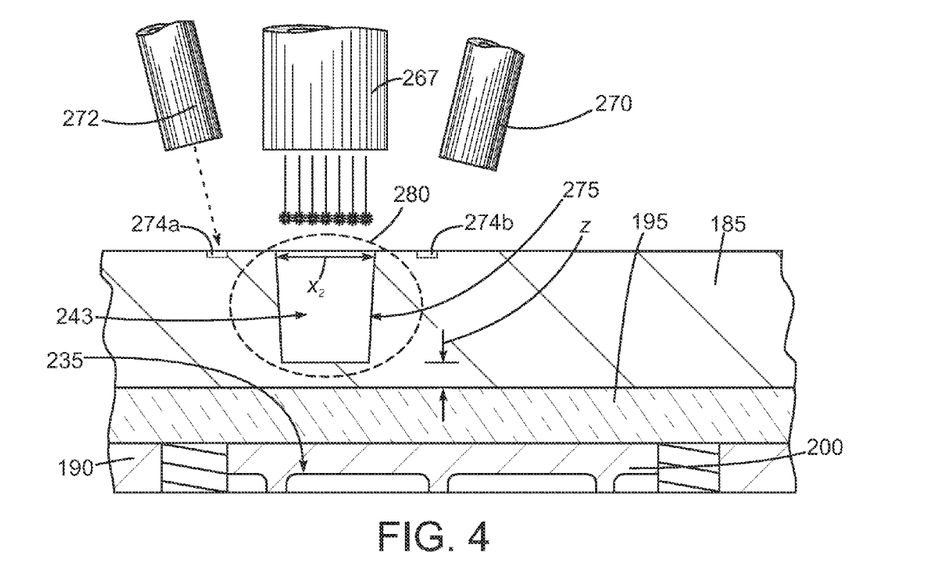
FIG. 4 is a sectional view of the chip of FIG. 3 depicting exemplary formation of a bore from the backside of the chip.

An exemplary technique for fabricating the conductor structure 240 depicted in FIG. 3 may be understood by referring now to FIGS. 4, 5, 6, 7, 8, 9 and 10 and initially to FIG. 4. FIG. 4 is a sectional view of the semiconductor chip 180 flipped over with the bulk semiconductor base 185 facing upward. Up to this point, the chip 180 has undergone deprocessing by etching, polishing or other planarization techniques so that any films and layers on the active semiconductor layer 190 that would obscure the device region 200 have been removed. The bore 243 should be fabricated with two objectives: (1) avoid damaging the structures in the active semiconductor layer 190; and (2) achieve a low aspect ratio that will facilitate eventual material deposition. To accomplish these goals, the bore 243 may be formed in stages using different techniques. As shown in FIG. 4, the bore 243 is initially formed part way through the bulk semiconductor 185. Through subsequent process steps to be described below, the bore 243 will be extended to the active semiconductor layer 190. Although a mask and etch scheme could be used to form the bore 243 at this stage, a less time consuming material removal process may be appropriate, such as a laser assisted etch. In an exemplary embodiment, the bore 243 may be initially formed by laser assisted chlorine etching wherein a laser source 267 is used in conjunction with an atmosphere of chlorine. This particular chemistry and laser assist may be appropriate where, for example, this semiconductor base layer 185 is composed of silicon. To ensure that the bore 243 will be accurately positioned, an infrared camera 270 may be used to locate the position of the area of interest 235 and a focused ion beam emitter 272 may be used to form fiducial marks 274a and 274b in the backside 245 of the semiconductor layer 185 around the area of interest. Any number of such fiducial marks 274a and 274b may be formed. With the fiducial marks 274a and 274b in place, the laser source 267 may be accurately aimed and activated to conduct the etch. It may be necessary to stop the laser assisted etch short of the buried insulating layer 195 as shown in order to avoid overheating and possibly damaging the circuit structures in the active semiconductor layer 190. If overheating is not a concern, then the etch could proceed to the buried insulating layer 195. The bore 243 may be rectangular, circular, oblong, oval, or other shapes. The lateral dimension $x_2$ of the top of the bore 243 may be determined by the laser spot size and/or the movement of the laser source 267 or the chip 180 in order to translate the laser spot in different positions as desired. In an exemplary embodiment, the laser radiation may be generated by an argon ion source with dual wavelengths of 488 nm and 515 nm and have a spot size may be about 1.0 micron. In order to facilitate subsequent material deposition steps, the bore 243 is advantageously formed with a relatively low aspect ratio. Accordingly, the side wall or walls 275 of the bore 243 are advantageously inwardly sloping as shown.

Figure 5:
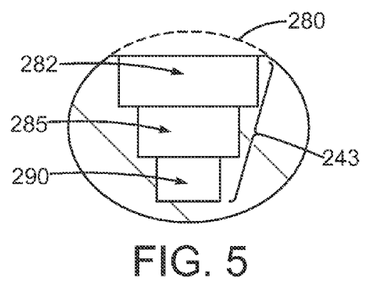
FIG. 5 is a magnified view of a portion of FIG. 4.

As noted briefly above, the bore 243 is advantageously formed with sloped side walls 275 to lessen the aspect ratio of the bore 243. In this regard, attention is now turned to FIG. 5, which is a magnified view of the portion of FIG. 4 circumscribed by the dashed oval 280. The bore 243 may be formed with a stair-stepped configuration as shown in FIG. 5. In this regard, the bore 243 may consist of a large diameter portion 282, a medium diameter or portion 285 and a smallest diameter portion 290. A stair-stepped construction such as that depicted in FIG. 5 for the bore 243 may be necessary since a laser assisted chlorine etch is highly anisotropic and thus in order to provide an inwardly tapering profile, several etches to provide the successively decreasing diameter portions 285 and 290 may be required. The number and sizes of the individual stair-stepped portions 280, 285 and 290 that make up the bore 243 are matters of design discretion.

Figure 6:
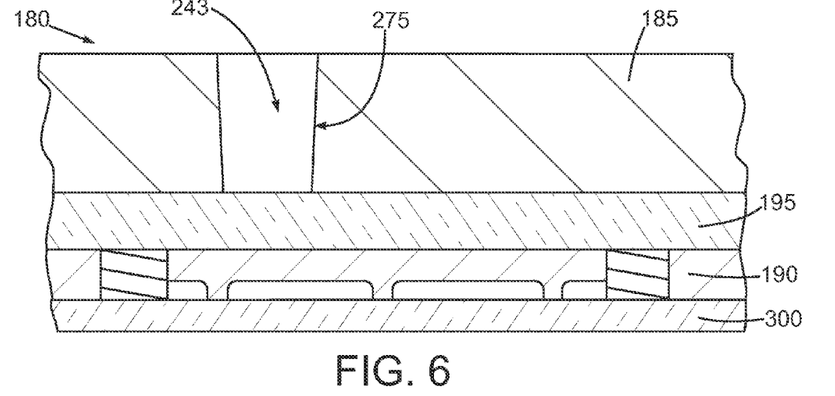
FIG. 6 is a sectional view of the chip of FIG. 3 depicting additional exemplary processing of the bore.

Referring now to FIG. 6, the bore 243 is extended down to the buried insulating layer 195. While a variety of techniques may be used to accomplish this material removal step, an exemplary embodiment utilizes a wet etchant that is active against silicon but relatively inactive against silicon dioxide, such as tetra methyl ammonium hydroxide (TMAH). In order to prevent the wet etchant from attacking the various circuit structures in the active semiconductor layer 190, an appropriate etch mask 300 may be applied to the semiconductor layer 190 prior to the etch. The composition of the etch mask 300 will depend upon the wet etchant selected. In an exemplary embodiment, a TMAH etchant is used along with a TMAH resistant material for the etch mask 300. Some desirable properties for the mask material 300 include the ready adhesion to silicon and silicon dioxide, relative ease of removability, mechanical strength to protect the underlying circuit structures in the semiconductor layer 190 as well as resistance to the TMAH etchant. In an exemplary embodiment, the etch resistant material for the mask 300 may be a polymer, such as ProTEK. The mask 300 may be drop coated, spin coated or brushed on to a thickness of about 6.0 to 10.0 μm. A thermal cure at first at about 140° C. for about 2.0 minutes and subsequently at about 205° C. for about 1.0 minute may be performed to finish the mask 300.

In an exemplary etch recipe, the chip 180 may be placed in a bath consisting of 60 ml of a 25% wt. water solution of TMAH mixed with 20 ml of isopropanol. The bath may be heated to about 83° C. Endpoint may be by timing determined from the etch rate and the thickness z of semiconductor remaining after the laser assisted etch. The etch rate of silicon using the just described TMAH bath is about 26 μm/hr. The thickness z of semiconductor material remaining in the bore 243 following the laser assisted etch may be determined with excellent accuracy by, for example, the laser source 267, which includes an ability to determine depth during focusing.

Figure 7:
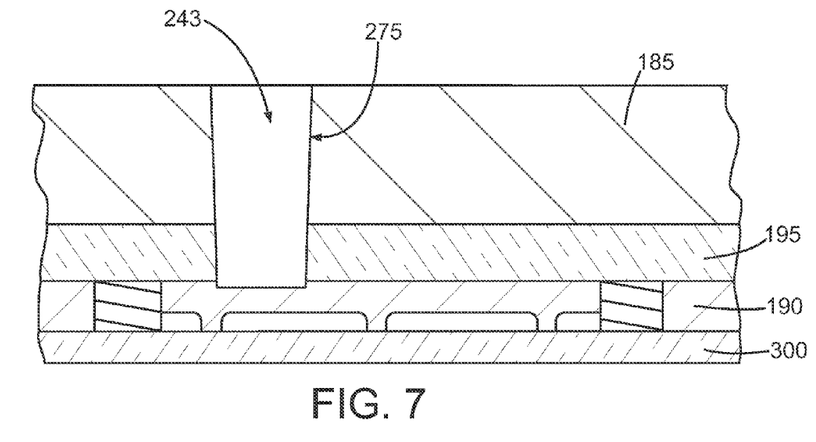
FIG. 7 is a sectional view of the chip of FIG. 3 depicting additional exemplary processing of the bore.

Referring now to FIG. 7, the bore 275 is extended down through the buried insulating layer 195. This material removal step may be performed by a variety of techniques. In an exemplary embodiment, a reactive ion etch is performed using the following recipe:

| | |
|---|---|
| Base vacuum | $2 \times 10^{-5}$ Torr |
| Pre-clean | oxygen plasma for 3 min. |
| | 100 sccm oxygen |
| | pressure = 60 mTorr |
| | plasma forward power @ 60 W and 224 V DC |
| Etch | $CHF_3$ (25 sccm) + Ar (25 sccm) |
| | pressure = 30 mTorr |
| | plasma forward power @ 130 W |
| Pump back | $2 \times 10^{-5}$ Torr |
| Vent with $N_2$ atmosphere | 760 Torr |

This etch recipe yields an etch rate of about 18 nm/min. Endpoint may again be by timing. The thickness of the buried insulating layer 195 will be known. For example, one exemplary insulating layer 195 may have a thickness of about 145 nm so the etch could be set to last about 8.0 minutes. Again, it is desirable to maintain the inwardly sloping character of the side walls 275 of the bore 243 in order to keep the aspect ratio of the bore 243 advantageously low. The etch 195 or other material removal step used to penetrate the buried insulating layer 195 advantageously extends the bore 243 at least to the semiconductor layer 190 and may extend slightly into the layer 190 as depicted in FIG. 7. An optional in-situ ion milling step may be used to penetrate any native oxide on the exposed semiconductor layer 195. The mask 300 may be advantageously left in place during etch of the bore 243 as desired. Depending upon the etch chemistry used for the reactive ion etch, some attack of the side walls 275 of the semiconductor base 185 may occur, albeit without adversely impacting the bore 243.

Figure 8:
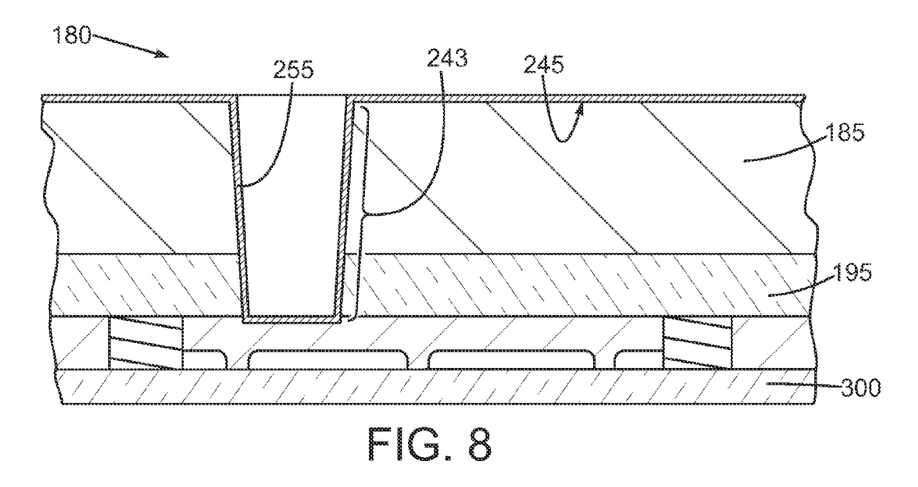
FIG. 8 is a sectional view of the chip of FIG. 3 depicting exemplary formation of a conductor structure in the bore.

Attention is now turned to FIG. 8. After the bore 243 is fully formed, the seed layer 255 is formed in the bore 243 and may extend over the back side 245 of the bulk semiconductor layer 185 as shown if desired. The seed layer 255 is designed to readily adhere to the side walls 275 of the bore 243 as not only in the silicon layer 185 but also the buried insulating layer 195. The seed layer 255 is also advantageously composed of a material that will readily adhere to the subsequently deposited conductor material 260 shown in FIG. 3. In a first exemplary embodiment, a graphite colloid suspension may be used for the seed layer 255. An exemplary graphite colloid is 16053-SPC PELCO Colloidal Graphite available from Pelco International in Redding, Calif. The graphite colloid may be drop cast into the bore 243. In an exemplary embodiment, the graphite colloid is drop cast, allowed to settle at room temperature in air and then thermally cured by slow ramp up to about 150° C. for about 2.0 hours. The seed layer 255 should be applied either while the chip 180 is maintained in a vacuum or immediately after the completion of the bore 243 to avoid the formation of oxides in the bore 243 proximate the semiconductor layer 1950 and the side walls of the bore 243 in the semiconductor bulk base 185. In a second exemplary embodiment, the seed layer 255 may consist of a metallic layer or laminate. For example, a thin (approximately 35 nm) layer of sputtered titanium may be followed with a thicker (approximately 350 nm) layer of copper, gold, palladium, mixtures of these or the like.

With the seed layer 255 in place, the chip 180 is ready to receive the conductor material 260. In this regard, attention is now turned to FIG. 9, which shows the deposition of the conductor material 260 into the bore 243 and adhering to the seed layer 255. Portions of the conductor 260 may extend out over the back side 245 of the semiconductor base 185 as desired. A variety of materials may be used for the conductor material 260. In the first exemplary embodiment, a silver epoxy, such as EPO-TEK P1011 available from Epoxy Technology in Billerica, Mass., may be drop cast and allowed to settle at room temperature and under vacuum conditions in the bore 243. The settling in vacuum allows any bubbles to escape from the silver epoxy. The silver epoxy may be subsequently thermally cured by slow ramp up to about 150° C. for about 4.0 hours. In the second exemplary embodiment, copper may be plated to about a 30 to 100 µm thickness to establish the conductor material 260.

Figure 9:
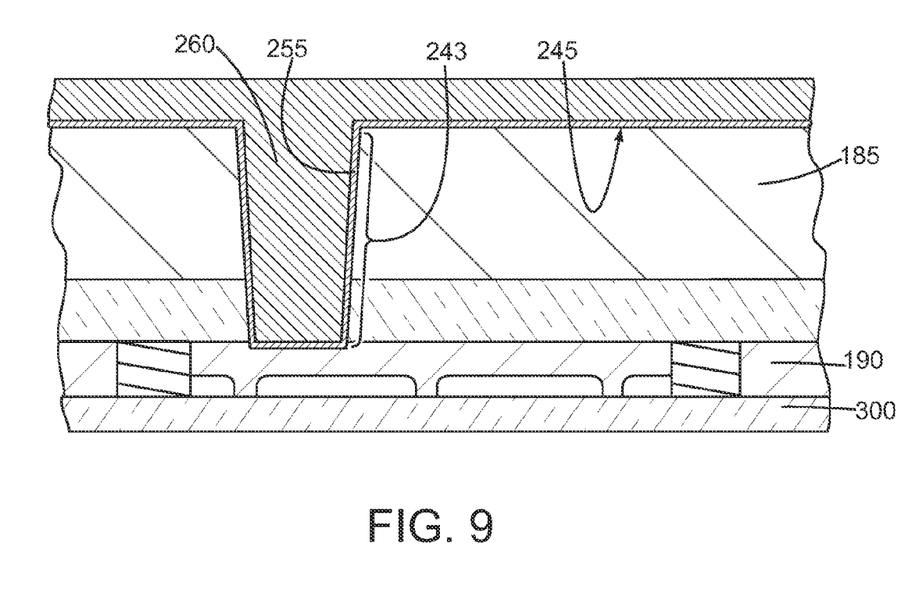
FIG. 9 is a sectional view of the chip of FIG. 3 depicting additional exemplary formation of the conductor structure.

Following the cure or plating of the conductor material 260, the etch mask 300 may be removed. A variety of techniques may be used to remove the etch mask. In one exemplary embodiment, a PROTEK material remover (MIAK) may be used to strip the mask 300 without damaging either the conductor 260 or the underlying circuit structures in the semiconductor layer 190.

Figure 10:
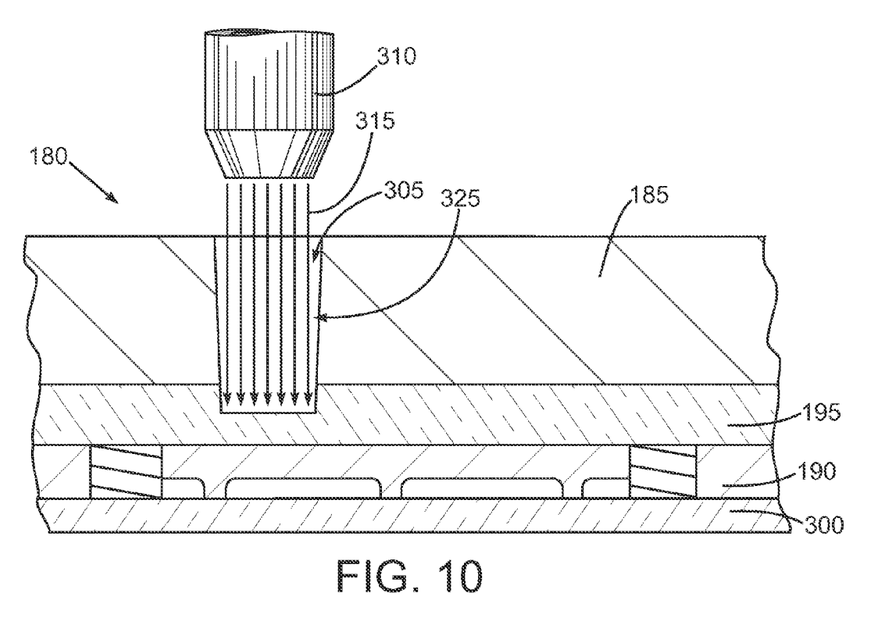
FIG. 10 is a sectional view of another portion of the chip of FIG. 3 depicting an alternate exemplary formation of a bore from the backside of the chip.
Figure 11:
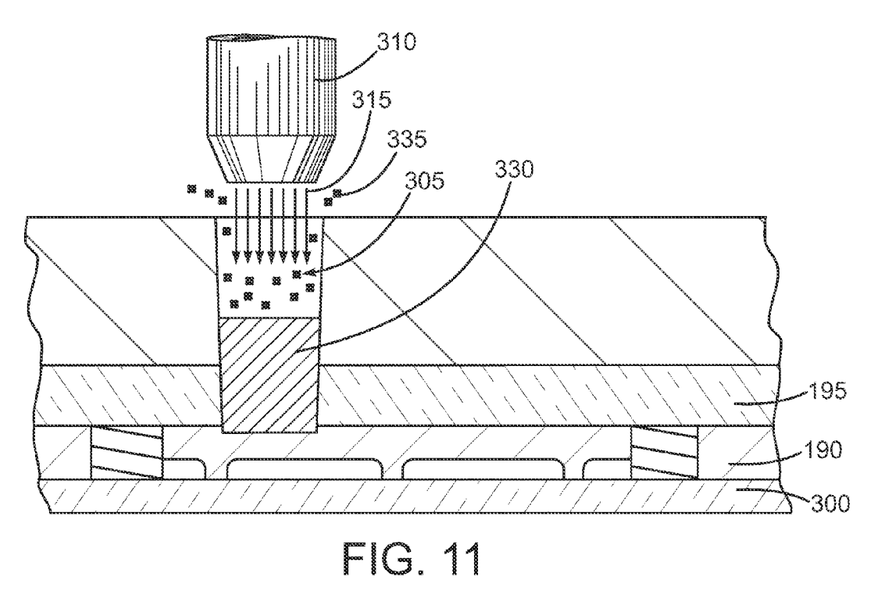
FIG. 11 is a sectional view like FIG. 10 but depicting alternate exemplary formation of a conductor structure in the bore.

An alternate exemplary embodiment and process flow may be understood by referring now to FIGS. 10 and 11. FIG. 10 is a sectional view of another portion of a semiconductor chip in which a bore 305 is formed extending first through the bulk semiconductor base 185 by the techniques described elsewhere herein such as the laser assisted chlorine etch and a follow on $XeF_2$ gas etch in a flip chip focus ion beam chamber (not shown). These two processes are used to form the bore 305 down to the buried insulating layer 190. At this stage, an ion beam etcher 310 is used to direct an ion beam 315 into the bore 305 to drill down through the buried insulating layer 195 to the underlying semiconductor layer 190. Again, both the laser assisted chlorine etch and the $XeF_2$ gas etch are advantageously performed so that an inwardly tapering side wall 325 of the bore 305 may be provided. A stair-step arrangement like that shown in FIG. 5 could be used.

Referring now to FIG. 11, following the ion beam etching of the buried insulting layer 195 down to and possibly into the semiconductor layer 190, an in-situ ion beam deposition of a conductor material, such as tungsten, may be performed to establish a conductor structure 330 in the bore 305. In this regard, tungsten-containing vapor 335 may be introduced proximate the ion beam 315 in order to establish the conductor structure 330. Other materials suitable for the conductor structure 330 include, for example, platinum, titanium, titanium-tungsten, gold or the like. If adhesion issue are contemplated, then laminates can be used, such as titanium followed by gold. As with the other embodiment, an etch mask 300 may be used to protect the underlying circuit structures of the semiconductor layer 190 during the material removal and deposition processes necessary to establish the conductor structure 330 in the bore 305.

Figure 12:
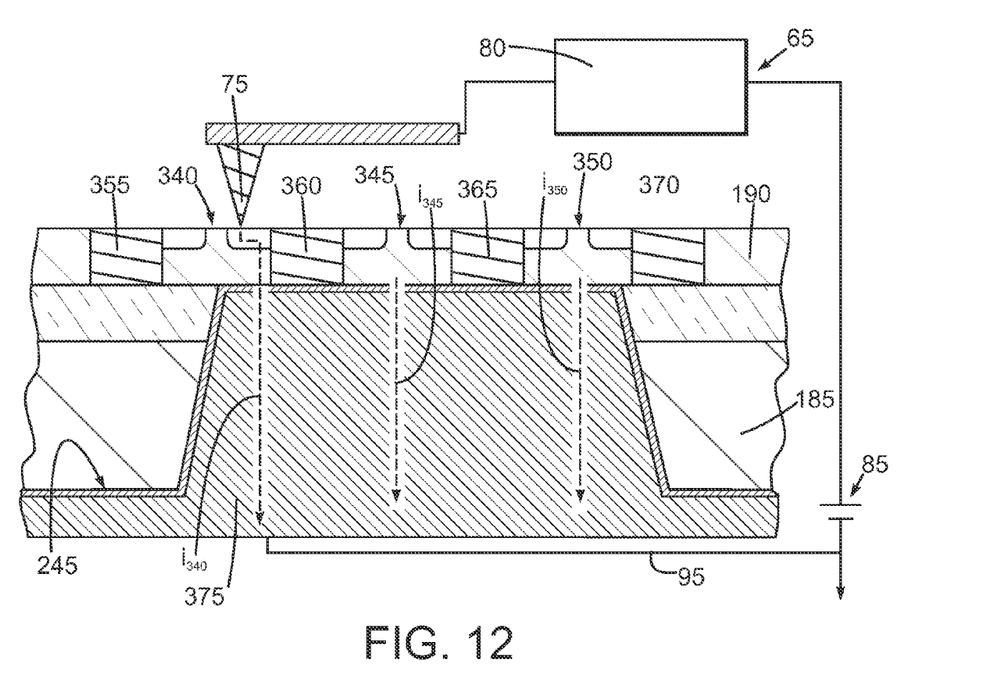
FIG. 12 is a sectional view of another portion of the chip of FIG. 3 depicting another exemplary conductor structure.

FIG. 12 is a sectional view of another portion of the semiconductor chip 180 that includes several p-channel active regions. In particular, three p-channel active regions 340, 345 and 350 are shown and isolated laterally by way of four isolation structures 355, 360, 365 and 370. The isolation structures 355, 360, 365 and 370 and the active p-channel regions 340, 345 and 350 are all part of the active semiconductor layer 190. Here, another backside conductor structure 375, which may be compositionally identical to any of the conductor structures disclosed elsewhere herein, is formed through the back side 245 of the bulk semiconductor layer 185 and established ohmic contact with not only the active region 340, but also the active regions 345 and 350. The conductor structure 375 is made large enough laterally to establish electrical contact with multiple p-channel active regions 340, 345 and 350. In this way, the limitations associated with the prior art and the blocking of lateral conductive pathways by isolation structures are overcome so that the SPM system 65 may be used to perform SPM analysis on all of the active regions 340, 345 and 350 and compare them using a common baseline. In this regard, the probe 75 tip may be positioned proximate the active region 340 and a current pathway $i_{340}$ is established from the probe tip 75 to the conductor 95 connected to the voltage source 85. Similarly, current pathways $i_{345}$ and $i_{350}$ are established to and from the active regions 345 and 350 by way of the conductor structure 375. The diagnostic instrument 80 may function as described elsewhere herein. Since the conductor structure 375 may be large, overall sheet resistance will be lower and thus provide for more sensitive measurements of device characteristics. Furthermore, a large conductor structure 375 can yield approximately equivalent sheet resistances for multiple areas of interest, which effectively cancels out any artifact associated with distance from the conductor 375.

Any of the backside conductor structures disclosed herein may be positioned wherever areas of interest of a semiconductor device are located. Once formed, the conductor structures enable a variety of testing to be performed. Examples include conducting atomic force microscopy, scanning spreading resistance microscopy, scanning capacitance microscopy, scanning tunneling microscopy to name just a few. It should be understood that the structures and techniques could be applied to other than CMOS devices.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    forming a bore from a backside of a semiconductor chip through a buried insulating layer and to a semiconductor device layer of the semiconductor chip, wherein the bore is formed by laser assisted etching and wet etching to the buried insulating layer and dry etching the buried insulating layer; and
    forming a conductor structure in the bore to establish an electrically conductive pathway between the semiconductor device layer and the conductor structure, wherein at least one fiducial mark is formed on the backside of the semiconductor chip to indicate a location of an area of interest, the bore being formed proximate the area of interest.

2. The method of claim 1, wherein the forming the conductor structure comprises forming a first conductive layer in the bore and a second conductive layer on the first conductive layer.

3. The method of claim 2, wherein the first conductive layer comprises a graphite colloid or a metal.

4. The method of claim 2, wherein the semiconductor device layer comprises a plurality of active regions laterally isolated by isolation structures, the method comprising forming the conductive structure to establish ohmic contact with the plurality of isolated active regions.

5. A method of manufacturing, comprising:
    forming a bore from a backside of a semiconductor chip through a buried insulating layer and to a semiconductor device layer of the semiconductor chip, wherein the semiconductor device layer comprises a plurality of active regions laterally isolated by isolation structures, the method comprising forming the conductive structure to establish ohmic contact with the plurality of isolated active regions;
    forming a conductor structure in the bore to establish an electrically conductive pathway between the semiconductor device layer and the conductor structure;
    electrically connecting a diagnostic instrument to the conductor structure and the semiconductor device layer; and
    performing a diagnostic test on the semiconductor chip with the diagnostic instrument.

6. The method of claim 5, wherein the forming the conductor structure comprises forming a first conductive layer in the bore and a second conductive layer on the first conductive layer.

7. The method of claim 6, wherein the first conductive layer comprises a graphite colloid or a metal.

8. The method of claim 5, wherein the forming the bore comprises etching.

9. The method of claim 8, comprising forming the bore by laser assisted etching and wet etching to the buried insulating layer and dry etching the buried insulating layer.

10. The method of claim 5, wherein the semiconductor device layer includes an area of interest, the bore being formed proximate the area of interest.

11. The method of claim 10, comprising forming at least one fiducial mark on the backside of the semiconductor chip to indicate a location of the area of interest.

12. The method of claim of claim 5, wherein the diagnostic test comprises scanning probe microscopy.

13. A method of manufacturing, comprising:
    forming a bore from a backside of a semiconductor chip through a buried insulating layer and to a semiconductor device layer of the semiconductor chip, wherein the bore is formed, initially, by laser assisted etching, followed by wet etching to the buried insulating layer and dry etching the buried insulating layer; and
    forming a conductor structure in the bore to establish an electrically conductive pathway between the semiconductor device layer and the conductor structure.

* * * * *